(12) United States Patent
Jiang et al.

(10) Patent No.: US 11,877,519 B2
(45) Date of Patent: Jan. 16, 2024

(54) SEMICONDUCTOR DEVICE MANUFACTURING METHOD

(71) Applicant: JIANGSU LEUVEN INSTRUMENTS CO. LTD, Jiangsu (CN)

(72) Inventors: Zhongyuan Jiang, Jiangsu (CN); Ziming Liu, Jiangsu (CN); Juebin Wang, Jiangsu (CN); Dongchen Che, Jiangsu (CN); Hushan Cui, Jiangsu (CN); Dongdong Hu, Jiangsu (CN); Lu Chen, Jiangsu (CN); Huiqun Ren, Jiangsu (CN); Zhiwen Zou, Jiangsu (CN); Kaidong Xu, Jiangsu (CN)

(73) Assignee: JIANGSU LEUVEN INSTRUMENTS CO. LTD, Jiangsu (CN)

( * ) Notice: Subject to any disclaimer, the term of this patent is extended or adjusted under 35 U.S.C. 154(b) by 365 days.

(21) Appl. No.: 17/289,756

(22) PCT Filed: May 23, 2019

(86) PCT No.: PCT/CN2019/088103
§ 371 (c)(1),
(2) Date: Apr. 29, 2021

(87) PCT Pub. No.: WO2020/093681
PCT Pub. Date: May 14, 2020

(65) Prior Publication Data
US 2021/0399217 A1 Dec. 23, 2021

(30) Foreign Application Priority Data
Nov. 8, 2018 (CN) .......................... 201811325919.2

(51) Int. Cl.
*H10N 50/01* (2023.01)
*H10N 50/80* (2023.01)

(52) U.S. Cl.
CPC ............. *H10N 50/01* (2023.02); *H10N 50/80* (2023.02)

(58) Field of Classification Search
CPC ........ H10N 50/01; H10N 50/80; H10N 50/10; H01L 21/3065; H01L 21/02071;
(Continued)

(56) References Cited

U.S. PATENT DOCUMENTS

2015/0102006 A1* 4/2015 Mudivarthi ............ H10B 61/00
216/11
2017/0125668 A1* 5/2017 Paranjpe ................ H10N 50/80

FOREIGN PATENT DOCUMENTS

CN 106676532 5/2017
CN 106676532 A * 5/2017 ................ C23F 4/00
(Continued)

OTHER PUBLICATIONS

"International Search Report (Form PCT/ISA/210) of PCT/CN2019/088103," dated Aug. 21, 2019, with English translation thereof, pp. 1-4.

*Primary Examiner* — Amar Movva
*Assistant Examiner* — Sandra Milena Rodriguez Villanu
(74) *Attorney, Agent, or Firm* — JCIP GLOBAL INC.

(57) ABSTRACT

A semiconductor device manufacturing method, wherein the etching apparatus used includes a sample loading chamber (15), a vacuum transition chamber (14), a reactive ion plasma etching chamber (10), an ion beam etching chamber (11), a film coating chamber (12), and a vacuum transport chamber (13). Without interrupting the vacuum, reactive ion etching is first adopted to etch to an isolation layer (102); then, ion beam etching is performed to etch into a fixed layer (101) and stopped near a bottom electrode metal layer (100), leaving only a small amount of the fixed layer (101); subsequently, reactive ion etching is adopted to etch to the bottom electrode metal layer (100); and finally, ion beam
(Continued)

cleaning is performed to remove metal residues and sample surface treatment, and coating protection is performed.

10 Claims, 8 Drawing Sheets

(58) Field of Classification Search
CPC ........ H01L 21/02041; H01J 2237/3341; C23F 4/00; G11C 2211/5615; G11C 11/161
See application file for complete search history.

(56) References Cited

FOREIGN PATENT DOCUMENTS

| | | |
|---|---|---|
| CN | 107623014 | 1/2018 |
| CN | 108232000 | 6/2018 |
| CN | 108242502 | 7/2018 |
| JP | 2003078185 | 3/2003 |
| WO | 2007109117 | 9/2007 |

* cited by examiner

SEMICONDUCTOR DEVICE MANUFACTURING METHOD

CROSS-REFERENCE TO RELATED APPLICATION

This application is a 371 of international application of PCT application serial no. PCT/CN2019/088103, filed on May 23, 2019, which claims the priority benefit of China application no. 201811325919.2, filed on Nov. 8, 2018. The entirety of each of the above mentioned patent applications is hereby incorporated by reference herein and made a part of this specification.

BACKGROUND

Technical Field

The present invention relates to the field of semiconductors, and in particular, to a semiconductor device manufacturing method.

Description of Related Art

As the feature size of semiconductor devices is further reduced, the conventional flash memory technology will reach its size limit. In order to further improve the device performance, research and development personnel begin to actively explore new structures, new materials, and new processes. In recent years, various types of novel non-volatile memories have developed rapidly. Among these memories, an MRAM has a high-speed read/write capability of a static random access memory (SRAM), high integration of a dynamic random access memory (DRAM), and power consumption far lower than that of the DRAM; and its performance does not degrade with the use time as compared with a flash memory (Flash). Due to these advantages, the MRAM gets more and more attention from the industry and is regarded as one of the powerful candidates for the next generation of "general-purpose" memory which is very likely to replace the SRAM, DRAM, and Flash. The industry and research institutions are committed to optimizing the circuit design, process methods, and integration solutions so as to obtain MRAM devices which can be successfully commercialized.

A magnetic tunnel junction (MTJ) is a core structure of the MRAM. An etching method is still required as the principal method for MTJ patterning. It is relatively difficult for the material of the MTJ to produce volatile products as compared with a dry etching material such as Fe, Co, or Mg; and further an etchant gas (for example, $Cl_2$) cannot be used, or otherwise the performance of the MTJ is degraded. Therefore, MTJ patterning can be realized by necessarily using a relatively complicated etching method, and an etching process is very difficult and challenging. The conventional etching of large-size MTJs is generally realized by means of ion beam etching (IBE). Because the IBE process uses inert gas, basically no chemical etching component is introduced into a reaction chamber, so that an MTJ sidewall is protected from chemical erosion. Under the condition of ensuring a clean sidewall, a perfect MTJ sidewall which is clean and not chemically damaged can be obtained by means of IBE. However, IBE also has shortcomings. On one hand, one implementation principle of the IBE is the use of a high physical bombardment force, but an excessively large physical bombardment force may cause disturbance in the ordering of atomic layers of the MTJ sidewall, especially in the isolation layer and the nearby core layer, thus disrupting the magnetic characteristics of the MTJ. On the other hand, IBE is realized necessarily by using a certain angle, which brings limitations to the IBE. As MTJ devices are made increasingly smaller in size, IBE cannot be performed to the bottom of the MTJ at a frequently used angle, thus failing to meet the requirements for separation of the MTJ devices, and making the patterning fail. Moreover, an IBE time is relatively long, causing a limited yield of each apparatus. Further, because reactive ion etching has a rapid etching speed and a high selection ratio, the combination of the two etching methods makes for a promising direction to solve the MTJ etching problem.

SUMMARY

To solve the foregoing problem, the present invention discloses a semiconductor device manufacturing method, which uses an etching device including a sample loading chamber, a vacuum transition chamber, a reactive ion plasma etching chamber, an IBE chamber, a film coating chamber, and a vacuum transport chamber, where the vacuum transition chamber is connected to the sample loading chamber and the vacuum transport chamber separately in a linkable manner; and the reactive ion plasma etching chamber, the IBE chamber, and the film coating chamber are separately connected to the vacuum transport chamber in a linkable manner. The method includes the following steps: a sample preparation step: forming a structure to be etched and containing a bottom electrode metal layer, an MTJ, a cap layer, and a mask layer on a semiconductor substrate, where the MTJ includes a fixed layer, an isolation layer, and a free layer; a sample loading step: loading a sample to the sample loading chamber, and the sample entering the vacuum transport chamber through the vacuum transition chamber; a first reactive ion etching step: the sample entering the reactive ion plasma etching chamber, etching the sample by means of reactive ion etching, and stopping etching at the isolation layer; and then the sample returning to the vacuum transport chamber; an IBE step: transferring the sample from the vacuum transport chamber to the IBE chamber, etching the sample into the fixed layer by means of IBE, and stopping etching near the bottom electrode metal layer; a second reactive ion etching step: the sample entering the reactive ion plasma etching chamber, continuously etching the sample by means of reactive ion etching, and stopping etching at the bottom electrode metal layer; and then the sample returning to the vacuum transport chamber; a first ion beam cleaning step: the sample entering the IBE chamber, and removing metal residues and treating a sample surface, so that metal contamination and a sidewall damage layer formed in the foregoing etching step are completely removed; and then the sample returning to the vacuum transport chamber; a protection step: the sample entering the film coating chamber, forming a dielectric thin film on the upper surface of and around the sample which has been subjected to etching, and then the sample returning to the vacuum transport chamber; and a sample take-out step: the sample returning from the vacuum transport chamber to the sample loading chamber through the vacuum transition chamber.

In the semiconductor device manufacturing method of the present invention, preferably, the method further includes the following steps after the IBE step and before the second reactive ion etching step: a second ion beam cleaning step: the sample continuously staying in the IBE chamber, and removing the metallic residues and treating the sample surface by using ion beams, so that the metal contamination and the sidewall damage layer formed in the foregoing etching step are completely removed; and then the sample returning to the vacuum transport chamber; a dielectric coating step: the sample entering the film coating chamber, and forming a dielectric thin film on the upper surface of and around the sample; and then the sample returning to the vacuum transport chamber; and a dielectric thin film opening step: the sample entering the reactive ion plasma etching chamber; etching the sample by using reactive ion plasma, to open the dielectric thin film on the top and bottom portions of the device but leave the part on the device sidewall; and then stopping etching.

In the semiconductor device manufacturing method of the present invention, preferably, the MTJ has a structure in which the fixed layer is above or below the isolation layer.

In the semiconductor device manufacturing method of the present invention, preferably, there is a single or multiple isolation layers in the MTJ.

In the semiconductor device manufacturing method of the present invention, preferably, gas used in the reactive ion plasma etching chamber includes inert gas, nitrogen, oxygen, fluorine-based gas, $NH_3$, amino gas, CO, $CO_2$, alcohol, or a combination thereof.

In the semiconductor device manufacturing method of the present invention, preferably, gas used in the IBE chamber includes inert gas, nitrogen, oxygen, or a combination thereof.

In the semiconductor device manufacturing method of the present invention, preferably, the dielectric thin film is a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or a combination thereof.

In the semiconductor device manufacturing method of the present invention, preferably, the dielectric thin film has a thickness of 0.5 nm to 50 nm in the dielectric coating step.

Without interrupting the vacuum, the present invention performs etching and cleaning steps by means of the combination of ion beam etching and reactive ion etching, which not only can effectively reduce sidewall metal contamination and structural damage caused by physical etching and improve etching efficiency, but also can reduce the risk of over etching and improve device performance and yield.

BRIEF DESCRIPTION OF THE DRAWINGS

FIG. 3 is a flowchart of an embodiment of a semiconductor device manufacturing method of the present invention;

DESCRIPTION OF THE EMBODIMENTS

To make the objective, technical solutions, and advantages of the present invention clearer, the technical solutions in the embodiments of the present invention are clearly and completely described below with reference to the accompanying drawings in the embodiments of the present invention. It should be noted that, the specific embodiments described herein are merely used for explaining the present invention, rather than limiting the present invention. The described embodiments are some rather than all of the embodiments of the present invention. Based on the described embodiments of the present invention, other embodiments acquired by those of ordinary skill in the art without creative effort all belong to the protection scope of the present invention.

In the description of the present invention, it should be noted that, the orientation or positional relationship indicated by the terms "upper", "lower", "steep", "tilted", etc. are based on the orientation or positional relationship shown in the accompanying drawings, and are only used for the convenience of describing the present invention and simplifying the description, rather than indicating or implying that the denoted device or element must have a specific orientation or be constructed and operated in a specific orientation. Therefore, these terms cannot be understood as limitations to the present invention. In addition, the terms "first" and "second" are merely used for description, but are not construed as indication or implying relative importance.

In addition, many specific details of the present invention, such as the structure, material, dimensions, and treatment process and technique of the device, are described below for a clearer understanding of the present invention. However, as those skilled in the art can understand, the present invention may not be implemented according to these specific details. Unless otherwise indicated below, various parts of the device may be made of materials known to those skilled in the art, or materials with similar functions developed in the future may be used.

Figure 1:
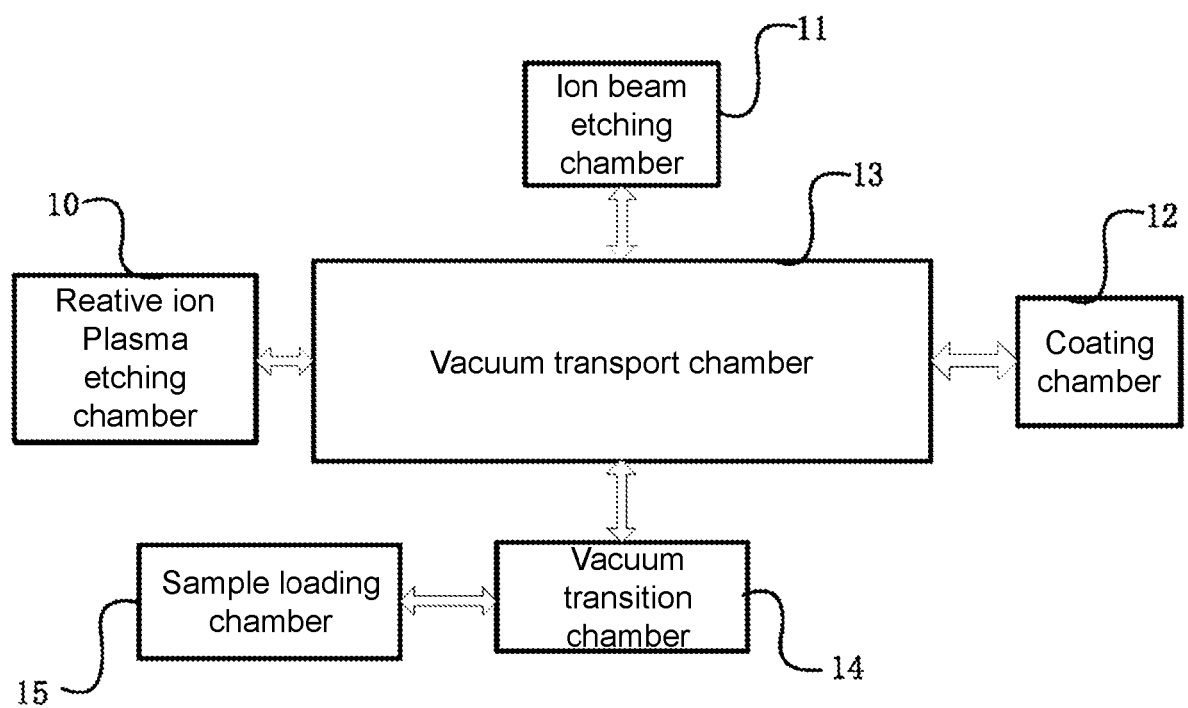
FIG. 1 is a functional block diagram of an etching device used in a semiconductor device manufacturing method of the present invention.

A device used in a semiconductor device manufacturing method of the present invention is described below with reference to the accompanying drawings. FIG. 1 is a functional block diagram of an etching device used in the semiconductor device manufacturing method of the present invention. As shown in FIG. 1, the etching device includes a reactive ion plasma etching chamber 10, an IBE chamber 11, a film coating chamber 12, a vacuum transport chamber 13, a vacuum transition chamber 14, and a sample loading chamber 15. The vacuum transition chamber 14 is connected to the sample loading chamber 15 and the vacuum transport chamber 13 separately in a linkable manner. The reactive ion plasma etching chamber 10, the IBE chamber 11, and the film coating chamber 12 are separately connected to the vacuum transport chamber 13 in a linkable manner. In addition, there may be multiple chambers of each type.

The reactive ion plasma etching chamber 10 may be an inductively coupled plasma (ICP) chamber, a capacitively coupled plasma (CCP) chamber, a helicon wave plasma chamber, or the like. The IBE chamber 11 may be an ion beam etching chamber, a neutral particle beam etching chamber, or the like. The film coating chamber 12 may be a physical vapor deposition (PVD) film coating chamber; and may also be a chemical vapor deposition (CVD) film coating chamber, such as a pulsed CVD film coating chamber, a plasma enhanced chemical vapor deposition (PECVD) film coating chamber, an ICP-PECVD film coating chamber, an atomic layer deposition (ALD) film coating chamber, or the like.

In addition, the etching device further includes a sample transfer system for realizing sample delivery between the chambers, a control system for controlling the chambers and the sample transfer system, a vacuum pumping system for achieving a vacuum degree required by each chamber, a cooling system, and other functional units included in a conventional etching device. These device structures may all be implemented by those skilled in the art by using existing technology.

Figure 3:
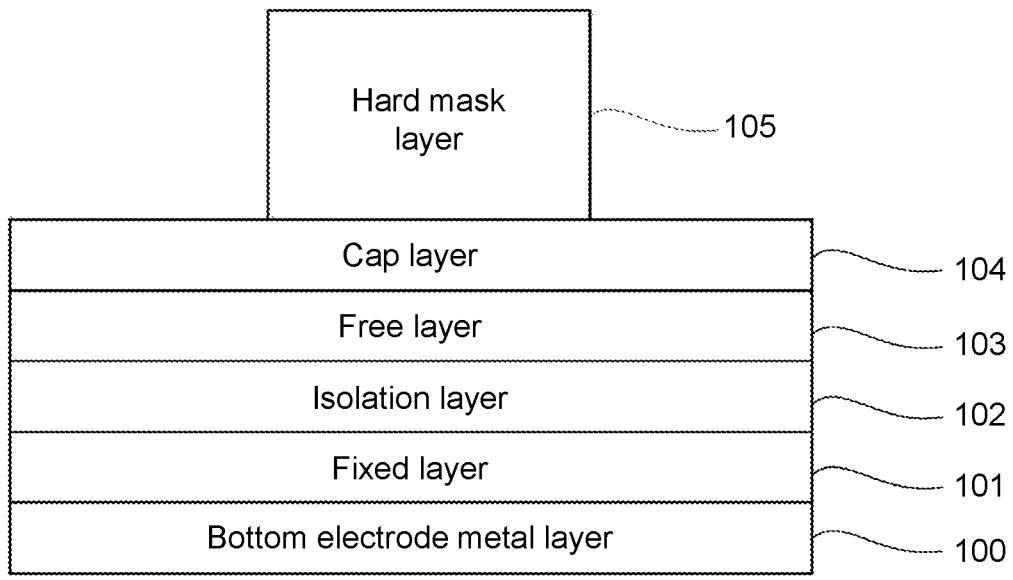
FIG. 3 is a schematic structural diagram of a device to be etched and containing an MTJ.

FIG. 3 is a schematic structural diagram of a device to be etched and containing an MTJ. As shown in FIG. 3, the structure to be etched includes a bottom electrode metal layer 100, the MTJ (including a fixed layer 101, an isolation layer 102, and a free layer 103), a cap layer 104, and a hard mask layer 105. It should be noted that, this structure is merely an example, and in the composition of the MTJ in an actual device application, the free layer may be below the isolation layer and the fixed layer may be above the isolation layer. There may be a single or multiple isolation layers in the MTJ. The semiconductor device manufacturing method of the present invention is also application to all these different structures.

Figure 2:
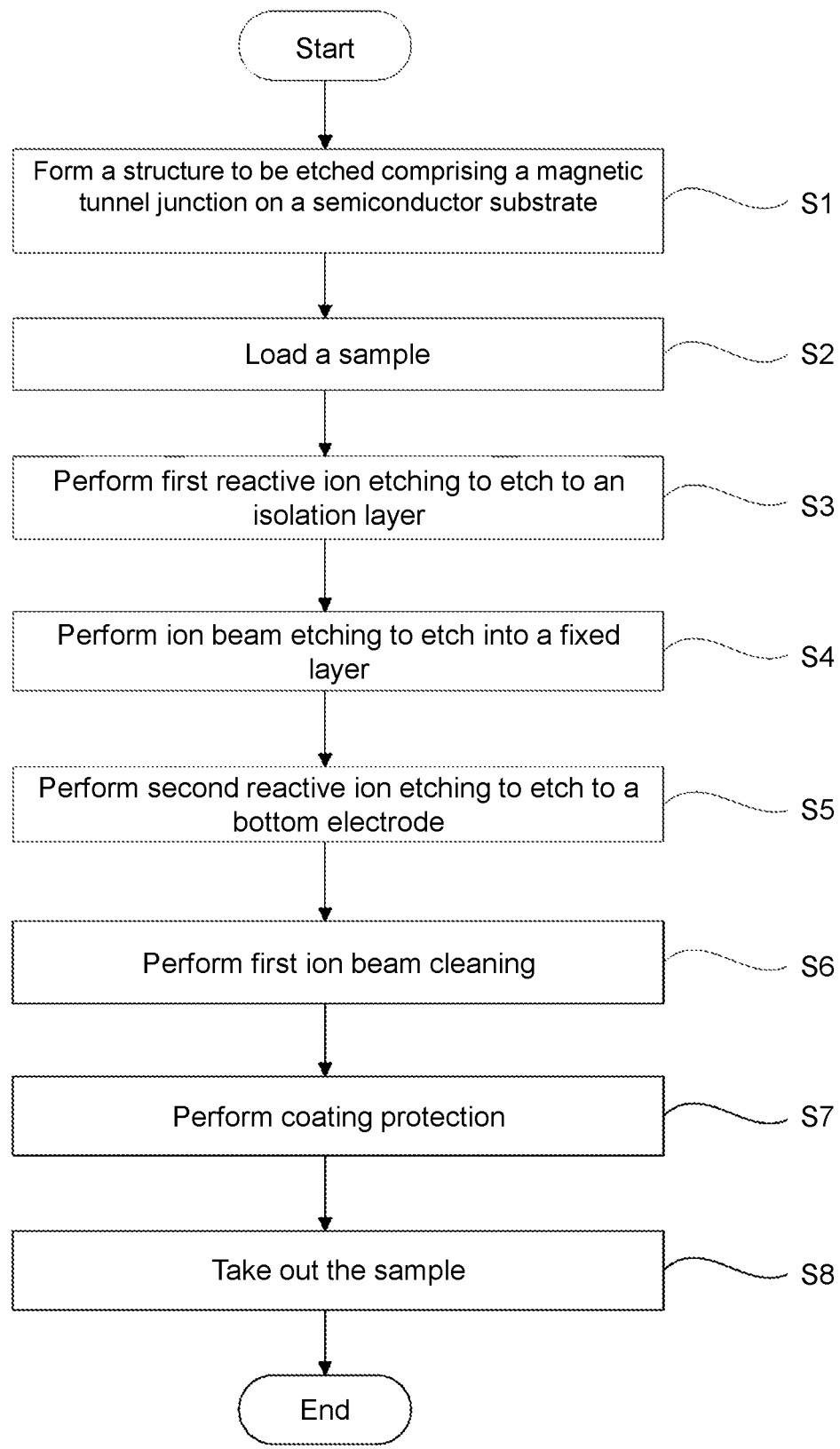
FIG. 2 is a flowchart of an embodiment of a semiconductor device manufacturing method of the present invention.

As shown in FIG. 2, the semiconductor device manufacturing method of the present invention is implemented by using the following steps. First, in a sample preparation step S1, a structure to be etched including an MTJ is formed on a semiconductor substrate, as shown in FIG. 3. A hard mask layer has a thickness of 50 nm and a height-to-width ratio of 2.5:1.

Afterwards, in a sample loading step S2, a sample is loaded to the sample loading chamber 15 and then enters the vacuum transport chamber 13 through the vacuum transition chamber 14.

Figure 4:
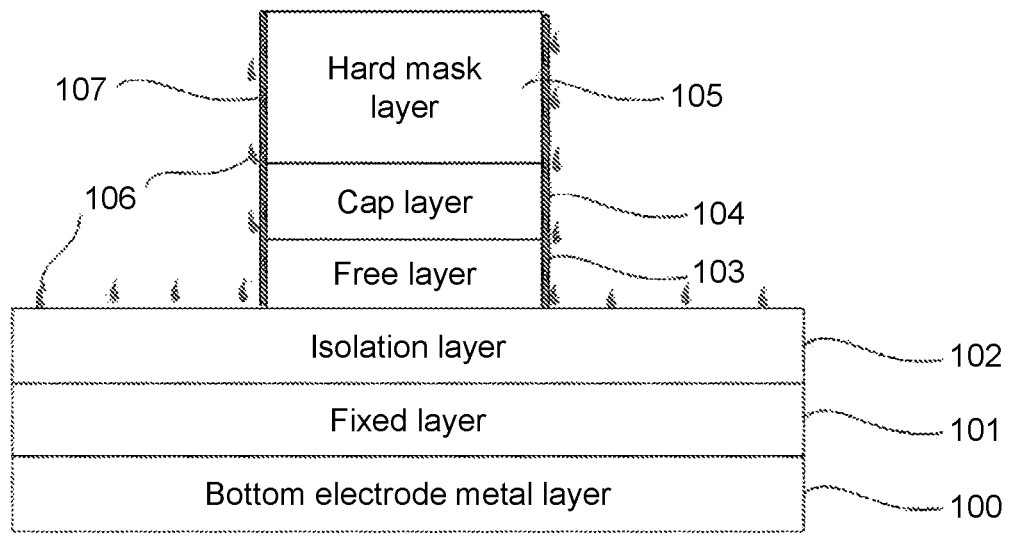
FIG. 4 is a schematic structural diagram of a device formed after a first reactive ion etching step.

Then, in a first reactive ion etching step S3, the sample enters the reactive ion plasma etching chamber 10, and is etched by using reactive ion plasma. Etching is stopped at the isolation layer. An etching endpoint is defined by using an automatic optical endpoint detector in the reactive ion plasma etching chamber. Then the sample returns to the vacuum transport chamber 13. Gas used in the reactive ion plasma etching chamber may be inert gas, nitrogen, oxygen, fluorine-based gas, $NH_3$, amino gas, CO, $CO_2$, alcohol, or the like. FIG. 4 is a schematic structural diagram of a device formed after the first reactive ion etching step, which schematically shows metal contamination 106 and an MTJ sidewall damage layer 107 that are formed in the first reactive ion etching process.

Figure 5:
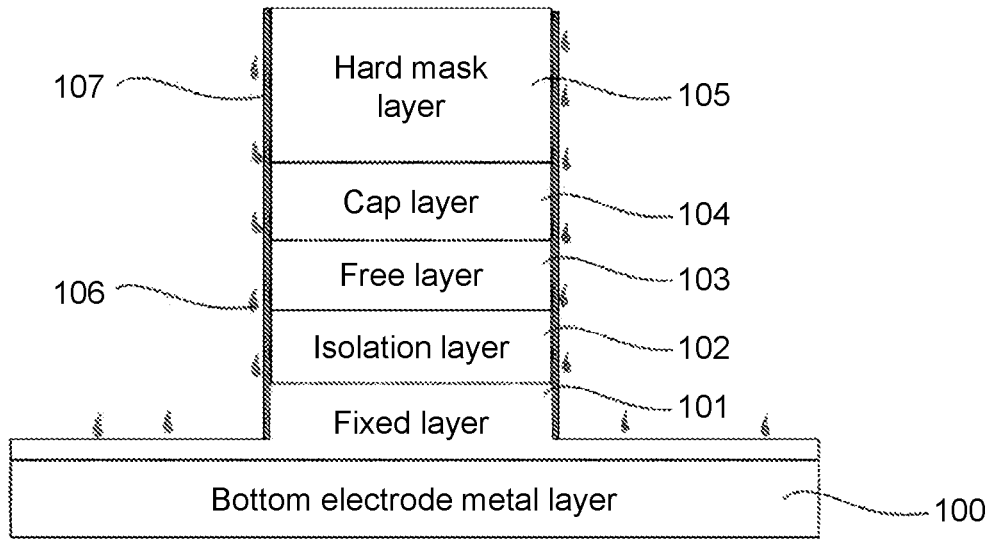
FIG. 5 is a schematic structural diagram of a device formed after a first IBE step.

Afterwards, in an IBE step S4, the sample is transferred from the vacuum transport chamber 13 to the IBE chamber 11, and is etched into the fixed layer 101 by means of IBE. Etching is stopped near the bottom electrode metal layer 100, leaving only a small amount of the fixed layer of about 2 nm. Then the sample returns to the vacuum transport chamber 13. An IBE angle is 75°, an etching time is 300 s, and a rotation speed of a sample stage is 10 rpm; but definitely, the present invention is not limited thereto. Gas used in the IBE may be inert gas, nitrogen, oxygen, or the like. An IBE angle preferably ranges from 10° to 80° (by taking perpendicularity to the wafer surface as a reference, the angle is 0° in a perpendicular situation). FIG. 5 is a schematic structural diagram of a device formed after the IBE step. Because IBE is mainly based on physical bombardment and has a small selection ratio, over etching is easily caused. By leaving a small amount of the fixed layer and by means of reactive ion etching for further etching in the subsequent step, the present invention can enhance a selection ratio of the etching by selecting an etching gas, thus effectively reducing over etching and improving the yield.

Figure 6:
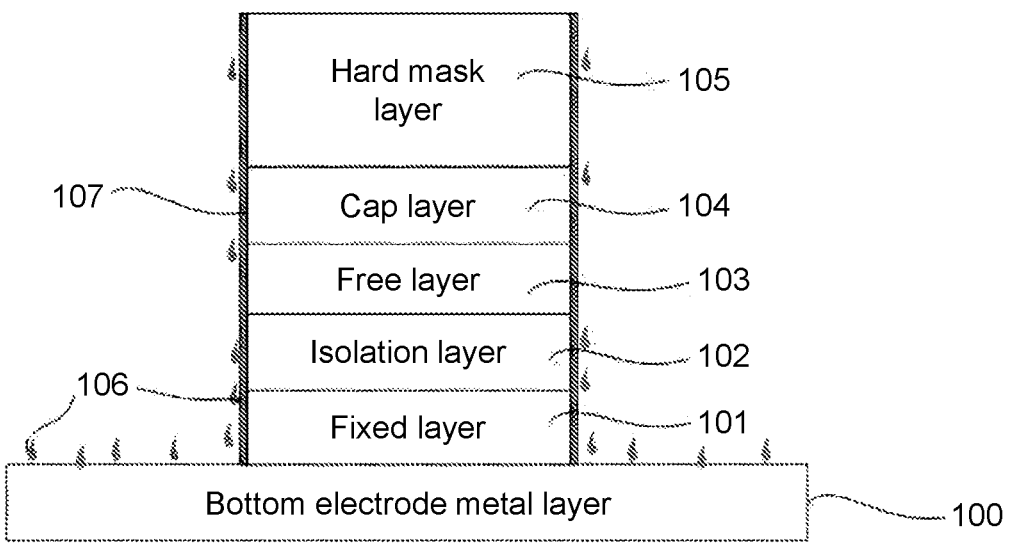
FIG. 6 is a schematic structural diagram of a device formed after a second reactive ion etching step.

Subsequently, in a second reactive ion etching step S5, the sample enters the reactive ion plasma etching chamber 10 and is continuously etched by means of reactive ion etching. Etching is stopped at the bottom electrode metal layer 100, and then the sample returns to the vacuum transport chamber 13. The used gas may be identical with or different from that used in the first reactive ion etching step, which may be inert gas, nitrogen, oxygen, fluorine-based gas, $NH_3$, amino gas, CO, $CO_2$, alcohol, or the like. FIG. 6 is a schematic structural diagram of a device formed after the second reactive ion etching step.

Figure 7:
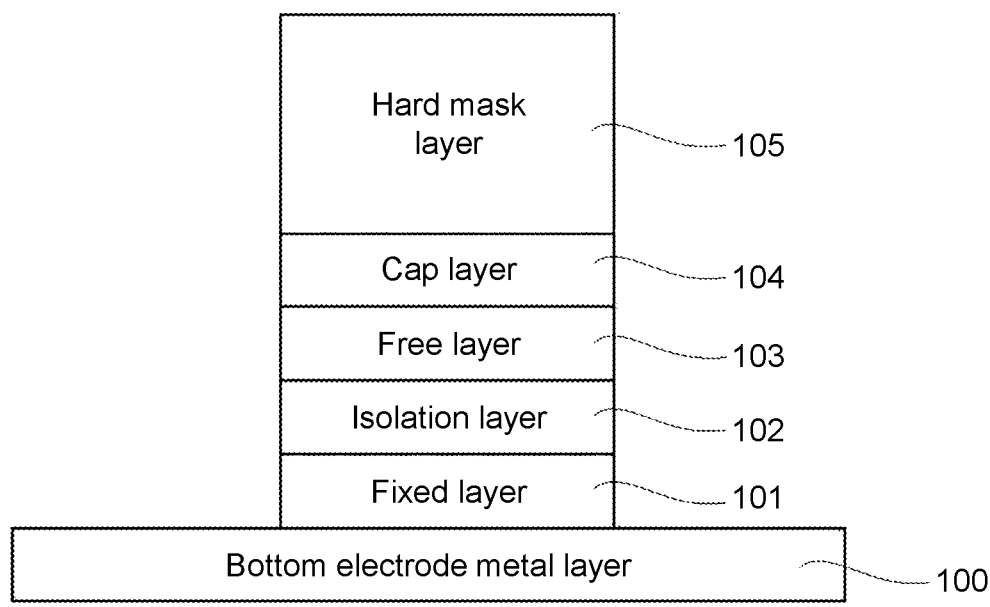
FIG. 7 is a schematic structural diagram of a device formed after a first ion beam cleaning step.

Nano-scale metal contamination or minimal metal contamination such as contamination less than 1 nm is produced in the foregoing etching process, and further a Nano-scale MTJ sidewall damage layer may also be formed in the etching process. In order to remove the metal contamination and the sidewall damage, in the following first ion beam cleaning step S6, the sample enters the IBE chamber 11, and the metal contamination is removed and the sample surface is treated by using ion beams, where an ion beam angle is 75°, a processing time is 120 s, and a rotation speed of the sample stage is 10 rpm, so that the metal contamination and the sidewall damage layer formed in the foregoing etching step are completely removed. Then the sample returns to the vacuum transport chamber 13. Gas used in the ion beam cleaning may be inert gas, nitrogen, oxygen, or the like. FIG. 7 is a schematic structural diagram of a device formed after the first ion beam cleaning step.

Figure 8:
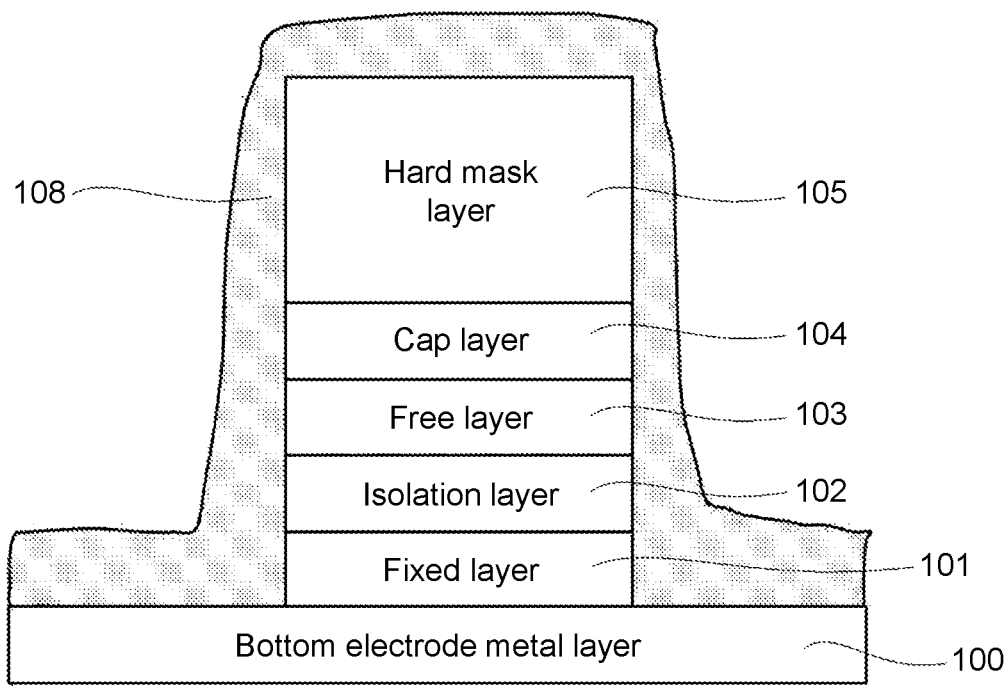
FIG. 8 is a schematic structural diagram of a device formed after a protection step.

In a protection step S7, the sample enters the film coating chamber 12 for coating protection, and a silicon-nitride dielectric thin film 108 with a thickness of 5 nm is formed on the upper surface of and around the sample. Then the sample returns to the vacuum transport chamber 13. Definitely, the present invention is not limited thereto. The material of the dielectric thin film may also be a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or other dielectric materials capable of realizing separation of adjacent MTJ devices. The dielectric thin film may have a thickness of above 1 nm but below 500 nm. After foregoing etching in the two chambers, the sidewall of the device is clean and complete separation is realized. The protection step can protect the device from damage when exposed to the atmosphere in the subsequent process, and further can realize complete insulation and isolation between devices. FIG. 8 is a schematic structural diagram of a device formed after the protection step.

Finally, in a sample take-out step S8, the sample returns from the vacuum transport chamber 13 to the sample loading chamber 15 through the vacuum transition chamber 14.

Figure 9:
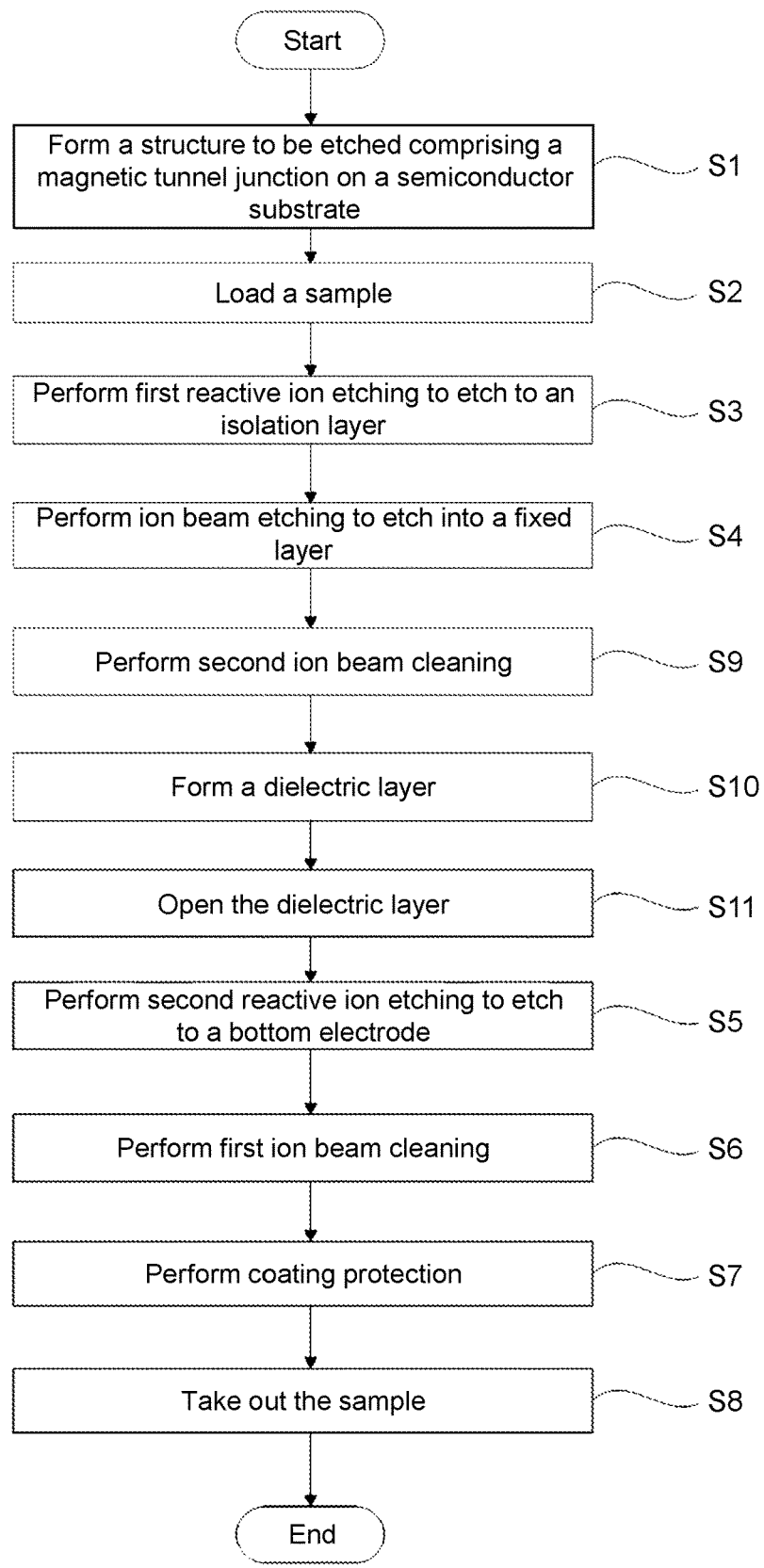
FIG. 9 is a flowchart of another embodiment of a semiconductor device manufacturing method of the present invention.

FIG. 9 is a flowchart of another embodiment of a semiconductor device manufacturing method of the present invention. As shown in FIG. 9, a difference between this embodiment and the foregoing embodiment lies in that, the method further includes the following steps after the IBE step S4 and before the second reactive ion etching step S5.

Figure 10:
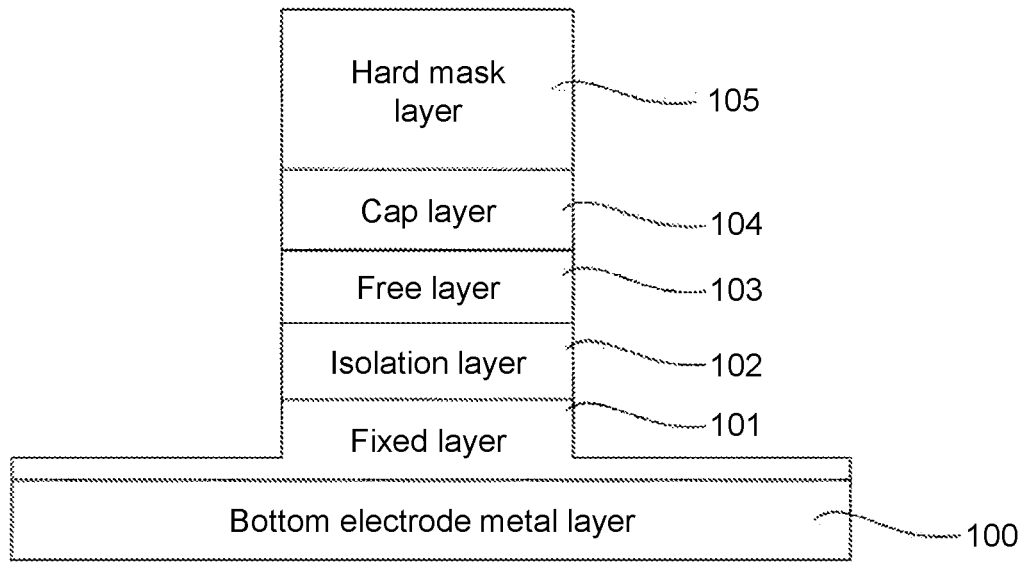
FIG. 10 is a schematic structural diagram of a device formed after a second ion beam cleaning step.

In a second ion beam cleaning step S9, the sample continuously stays in the IBE chamber 11, and metallic residues are removed and the sample surface is treated by using ion beams, so that the metal contamination and the sidewall damage layer formed in the foregoing etching step are completely removed, to obtain a structure shown in FIG. 10. Then the sample returns to the vacuum transport chamber 13. Gas used in the ion beam cleaning may be inert gas, nitrogen, oxygen, or the like; and a used angle preferably ranges from 10° to 80°. The gas and the angle used in this step may be identical with or different from those used in the first ion beam cleaning step.

Figure 11:
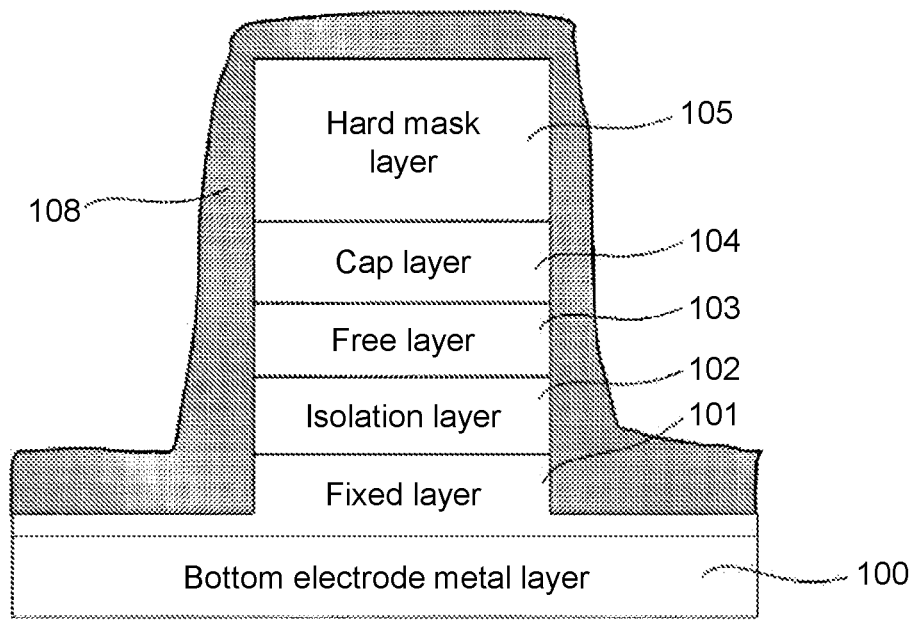
FIG. 11 is a schematic structural diagram of a device formed after a dielectric coating step.

In a dielectric coating step S10, the sample enters the film coating chamber, and a silicon-nitride dielectric thin film 108 with a thickness of 3 nm is formed on the upper surface of and around the sample, to obtain a structure shown in FIG. 11. Then the sample returns to the vacuum transport chamber 13. Definitely, the present invention is not limited thereto. The material of the dielectric thin film may also be a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or other dielectric materials capable of realizing separation of adjacent MTJ devices. The dielectric thin film may have a thickness of 0.5 nm to 50 nm.

Figure 12:
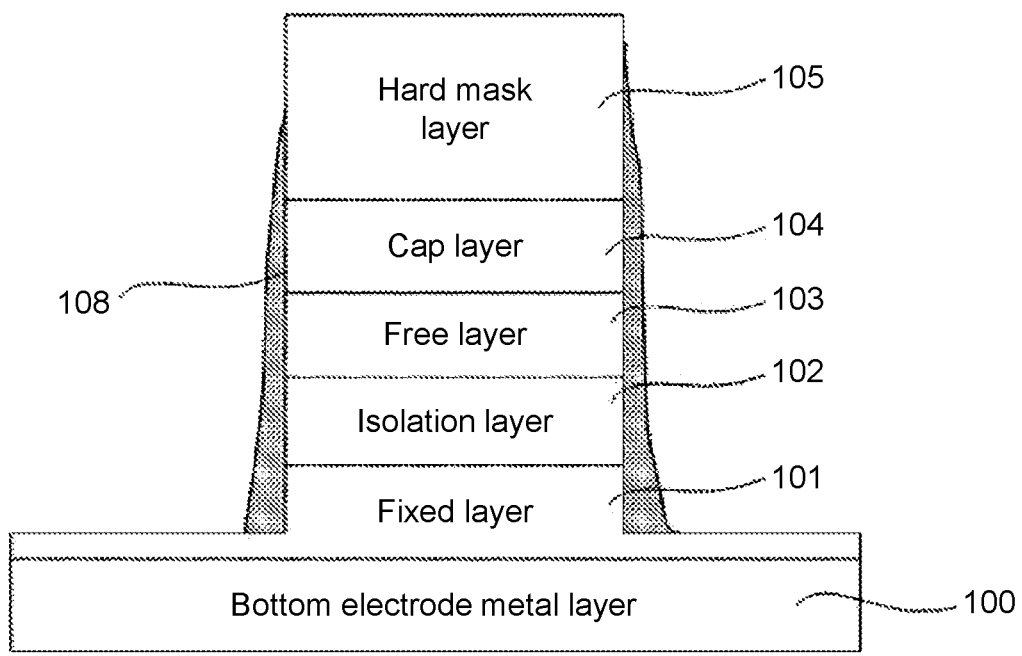
FIG. 12 is a schematic structural diagram of a device formed after a dielectric thin film opening step.

In a dielectric thin film opening step S11, the sample enters the reactive ion plasma etching chamber 10, and is etched by using reactive ion plasma, to open the dielectric thin film on the top and bottom portions of the device but leave the part on the device sidewall. Then etching is stopped, to obtain a structure shown in FIG. 12.

By introducing the foregoing steps, the structure which has been subjected to etching can be protected from an adverse effect brought by the subsequent etching step, thus further improving the device performance. In addition, after part of the MTJ sidewall is protected with a dielectric thin film, more reactive gas can be used to etch the remaining MTJ, so that etching of part of the film can be realized by the mechanism of chemical reactions, thus reducing metal contamination to the sidewall due to physical etching and further improving the etching efficiency. Moreover, the present invention realizes minimal exposure of the MTJ core layer to the plasma, thus reducing magnetic damage of the plasma to the MTJ and improving the yield.

The above describes specific implementations of the semiconductor device manufacturing method of the present invention in detail, but the present invention is not limited thereto. The specific implementations of the steps may vary from each other according to different conditions. In addition, the order of some steps can be changed, and some steps can be omitted. For an MTJ in which the free layer is below the isolation layer and the fixed layer is above the isolation layer, correspondingly, etching is stopped near the bottom electrode metal layer in the isolation layer in the IBE step.

The above merely describes a preferred embodiment of the present invention, but the protection scope of the present invention is not limited thereto. Changes or replacements easily conceived by any person skilled in the art within the technical scope of the present invention all fall within the protection scope of the present invention.

What is claimed is:

1. A semiconductor device manufacturing method, using an etching device comprising a sample loading chamber, a vacuum transition chamber, a reactive ion plasma etching chamber, an ion beam etching (IBE) chamber, a film coating chamber, and a vacuum transport chamber, wherein the vacuum transition chamber is connected to the sample loading chamber and the vacuum transport chamber separately in a linkable manner; the reactive ion plasma etching chamber, the IBE chamber, and the film coating chamber are separately connected to the vacuum transport chamber in a linkable manner; wherein the method comprises the following steps:

a sample preparation step: forming a structure to be etched and containing a bottom electrode metal layer, a magnetic tunnel junction (MTJ), a cap layer, and a mask layer on a semiconductor substrate, wherein the MTJ comprises a fixed layer, an isolation layer, and a free layer;

a sample loading step: loading a sample to the sample loading chamber, and the sample entering the vacuum transport chamber through the vacuum transition chamber;

a first reactive ion etching step: the sample entering the reactive ion plasma etching chamber, etching the sample by means of reactive ion etching, and stopping etching at the isolation layer; and then the sample returning to the vacuum transport chamber;

an IBE step: transferring the sample from the vacuum transport chamber to the IBE chamber, etching the sample into the fixed layer by means of IBE, and stopping etching near the bottom electrode metal layer;

a second reactive ion etching step: the sample entering the reactive ion plasma etching chamber, continuously etching the sample by means of reactive ion etching, and stopping etching at the bottom electrode metal layer; and then the sample returning to the vacuum transport chamber;

a first ion beam cleaning step: the sample entering the IBE chamber, and removing metal residues and treating a sample surface, so that metal contamination and a sidewall damage layer formed in the foregoing etching step are completely removed; and then the sample returning to the vacuum transport chamber;

a protection step: the sample entering the film coating chamber, forming a dielectric thin film on the upper surface of and around the sample which has been subjected to etching, and then the sample returning to the vacuum transport chamber; and a sample take-out step: the sample returning from the vacuum transport chamber to the sample loading chamber through the vacuum transition chamber, wherein the method further comprises the following steps after the step of etching the sample into the fixed layer in the IBE step and before the step of stopping etching at the bottom electrode metal layer in the second reactive ion etching step:

a second ion beam cleaning step: the sample continuously staying in the IBE chamber, and removing the metal residues and treating the sample surface by using ion beams, so that the metal contamination and the sidewall damage layer formed in the foregoing etching step are completely removed; and then the sample returning to the vacuum transport chamber;

a dielectric coating step: the sample entering the film coating chamber, and forming a dielectric thin film on the upper surface of and around the sample; and then the sample returning to the vacuum transport chamber; and a dielectric thin film opening step: the sample entering the reactive ion plasma etching chamber; etching the sample by using reactive ion plasma, opening the dielectric thin film on the top and bottom portions of the device but leaving part of the dielectric thin film on the device sidewall; and then stopping etching.

2. The semiconductor device manufacturing method according to claim 1, wherein the MTJ has a structure in which the fixed layer is above or below the isolation layer.

3. The semiconductor device manufacturing method according to claim 1, wherein there is a single isolation layer or multiple isolation layers in the MTJ.

4. The semiconductor device manufacturing method according to claim 1, wherein gas used in the reactive ion plasma etching chamber comprises inert gas, nitrogen, oxygen, fluorine-based gas, $NH_3$, amino gas, CO, $CO_2$, alcohol, or a combination thereof.

5. The semiconductor device manufacturing method according to claim 1, wherein gas used in the IBE chamber comprises inert gas, nitrogen, oxygen, or a combination thereof.

6. The semiconductor device manufacturing method according to claim 1, wherein the dielectric thin film is a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or a combination thereof.

7. The semiconductor device manufacturing method according to claim 1, wherein the dielectric thin film has a thickness of 0.5 nm to 50 nm in the dielectric coating step.

8. The semiconductor device manufacturing method according to claim 1, wherein gas used in the IBE chamber comprises inert gas, nitrogen, oxygen, or a combination thereof.

9. The semiconductor device manufacturing method according to claim 1, wherein the dielectric thin film is a group IV oxide, group IV nitride, group IV nitrogen oxide, transition metal oxide, transition metal nitride, transition metal nitrogen oxide, alkaline earth metal oxide, alkaline earth metal nitride, alkaline earth metal nitrogen oxide, or a combination thereof.

10. The semiconductor device manufacturing method according to claim 1, wherein the dielectric thin film has a thickness of 0.5 nm to 50 nm in the dielectric coating step.

* * * * *